(12) United States Patent
Hochleitner et al.

(10) Patent No.: US 8,144,826 B2
(45) Date of Patent: Mar. 27, 2012

(54) CLOCK SIGNAL RECOVERY DEVICE AND METHOD FOR RECOVERING CLOCK SIGNALS

(75) Inventors: Josef Hochleitner, Herzogenaurach (DE); Harald Karl, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 623 days.

(21) Appl. No.: 12/302,922

(22) PCT Filed: May 31, 2006

(86) PCT No.: PCT/DE2006/000971
§ 371 (c)(1),
(2), (4) Date: Dec. 1, 2008

(87) PCT Pub. No.: WO2007/137538
PCT Pub. Date: Dec. 6, 2007

(65) Prior Publication Data
US 2009/0189648 A1    Jul. 30, 2009

(51) Int. Cl.
*H04L 7/00* (2006.01)
(52) U.S. Cl. ........ 375/354; 375/355; 375/371; 375/375; 375/372; 375/376; 327/98; 327/243; 327/291

(58) Field of Classification Search .................. 375/355, 375/375, 354, 372, 371, 376; 327/98, 291, 327/243
See application file for complete search history.

(56) References Cited

U.S. PATENT DOCUMENTS

| | | | |
|---|---|---|---|
| 4,700,084 A * | 10/1987 | Honaker, Jr. ............... | 327/98 |
| 6,853,696 B1 * | 2/2005 | Moser et al. ............... | 375/375 |
| 6,856,659 B1 * | 2/2005 | Pierrick ..................... | 375/355 |
| 2006/0140319 A1 * | 6/2006 | Eldredge et al. ........... | 375/371 |

OTHER PUBLICATIONS

Witte et al., "Simple Clock Extraction Circuit Using a Self Sustaining Monostable Multivibrator Output Signal", Electronics Letters, IEE Stevenage, GB, vol. 19, Nr. 21, Oct. 13, 1983, pp. 897-898, ISSN: 0013-5194.
Ken Yang C. K.: "Timing Recovery", Internet Citation, [Online] Jun. 4, 2001, XP002264983, found in Internet:URL:www.icsl.ucla.edu/~yang/ee219a/ee219a_lect_crc.pdf, on Dec. 12, 2003.

* cited by examiner

*Primary Examiner* — Eva Puente
(74) *Attorney, Agent, or Firm* — Laurence A. Greenberg; Werner H. Stemer; Ralph E. Locher

(57) ABSTRACT

A clock signal recovery device has a digital data signal input for the input of a digital data signal and a clock signal output for the output of a recovered clock signal. The digital data signal has a given nominal clock signal frequency. The clock signal recovery device is a digital circuit.

12 Claims, 3 Drawing Sheets

CLOCK SIGNAL RECOVERY DEVICE AND METHOD FOR RECOVERING CLOCK SIGNALS

BACKGROUND OF THE INVENTION

Field of the Invention

The invention relates to a clock signal recovery device with a digital data signal input for feeding in a digital data signal having a predetermined nominal clock signal frequency, and a clock signal output for outputting a recovered clock signal.

It is known that modern synchronous communication protocols on the physical transmission layer frequently use a line or data coding based on the 4B/5B or 8B/10B coding. In this context, the data and the clock signal are combined in a coding chip to form a single bit stream which is subsequently sent via a transmission medium such as, e.g. radio or optical waveguide. As part of the coding, the 4B or 8B data signals are expanded to 5- or 10-bit wide data symbols by adding further bits. Adding these further bits ensures that the transmitted signal is free of direct current and there is additionally an adequate number of bit changes or edges in the bit stream. Following this, the data symbols are decoded again into the original data content, that is to say into 4-bit or 8-bit data signals in accordance with known methods.

It is known that the clock signal can be reconstructed from the received data bit stream with the aid of analog phase control loops, usually phase-locked loops PLL. In these analog phase-locked loops PLL, the frequency and the phase of a controllable clock generator are changed until its clock edges match the edges of the data signal. Following this, the data bit stream present at the input is sampled with the clock signal generated in this manner and decoded with the aid of this same clock signal. However, the phase-locked loops necessary for generating the clock signal require very special analog circuits which are costly.

Accordingly, the invention is based on the object of specifying a clock signal recovery device which can be implemented more cost effectively than previous clock signal recovery devices.

BRIEF SUMMARY OF THE INVENTION

According to the invention, this object is achieved by a clock signal recovery device having the features according to patent claim 1. Advantageous embodiments of the clock signal recovery device according to the invention are specified in subclaims.

According to the invention, it is accordingly provided that the clock signal recovery device is formed by a digital circuit.

An essential advantage of the clock signal recovery device according to the invention can be seen in the fact that it can be produced without the aid of analog components and can thus be implemented, for example exclusively by using standard logic chips such as, e.g. FPGA (freely programmable gate arrays) or ASIC chips.

Such a clock signal recovery device can be formed in a particularly simple and thus advantageous manner if it has a signal change detector which detects signal changes of at least one predetermined type of signal change of the data signal and in each case generates a pulse with each signal change. The signal change detector can detect, for example, a signal change from a logical 0 to a logical 1 or, instead, also from a logical 1 to a logical 0. As an alternative, it is also possible to design the signal change detector in such a manner that it can detect both types of signal changes, that is to say from 0 and 1 and conversely.

The clock signal recovery device preferably also has an auxiliary pulse generating device which generates auxiliary-pulses with the nominal clock signal frequency of the data signal. An output device connected to the signal change detector and the auxiliary-pulse generating device is preferably designed in such a manner that it forms an output pulse in each case when a pulse is present and also when an auxiliary pulse is present and generates the recovered clock signal with the output pulses thus formed.

With regard to an adaptation of the phase position which is as fast as possible of the recovered clock signal to the phase position of the digital data signal, it is considered to be advantageous if the auxiliary pulse generating device is connected at its input to an output of the output device and is designed in such a manner that the timing of the generation of the auxiliary pulses is controlled, particularly triggered, by signal changes of the recovered clock signal.

The auxiliary pulse generating device can be designed, for example, in such a manner that it generates an auxiliary pulse in each case after each output pulse of the recovered clock signal, for example after expiry of the duration of a period corresponding to the nominal clock signal frequency.

The clock signal recovery device preferably comprises a free-running clock generator, the generator frequency of which has a predetermined multiple of the nominal clock signal frequency of the data signal.

The predetermined multiple can be, for example, an integral multiple and is preferably at least 3.

The signal change detector has preferably applied to it the output signal of the clock generator and detects the signal changes of the data signal by oversampling with the generator frequency.

The output signal can be formed in a particularly simple and thus advantageous manner by means of a simple flip flop, particularly a D-type flip flop.

The flip flop, together with the auxiliary pulse generating device, advantageously forms a binary counter which can count at least up to the predetermined multiple in binary notation. If the predetermined multiple is, for example, 3, the binary counter can be composed, for example, of two D-type flip flops, one of which forms the output device, and an AND gate.

The digital circuit of the clock signal recovery device is preferably formed exclusively by digital gates or flip flops since such components are available as standard in standard FPGA chips or similar components such as ASIC chips.

In addition, a method for forming a recovered clock signal from a digital data signal which has a predetermined nominal clock signal frequency is considered to be an independent invention.

To be able to carry out such a method in a particularly simple and cost-effective manner, it is provided, according to the invention, that the clock signal recovery is carried out only digitally.

According to a preferred embodiment of this method, it is provided that the data signal is sampled with a generator frequency corresponding to an integral multiple of the nominal clock signal frequency and signal changes of at least one predetermined type of signal change of the data signal are detected. With each detected signal change, a pulse is generated. In addition, auxiliary pulses are generated with the nominal clock signal frequency of the data signal and when a pulse or an auxiliary pulse is present, an output pulse is formed in each case. The recovered clock signal is generated by means of the output pulses thus formed.

In the text which follows, the invention will be explained in greater detail with reference to exemplary embodiments in which, by way of example,

DESCRIPTION OF THE INVENTION

In FIGS. 1 to 4, the same reference symbols are always used for identical or comparable components or signals. For the rest, it is assumed by way of example that all sampling is done with the positive clock edge unless otherwise specified in an individual case.

Figure 1:
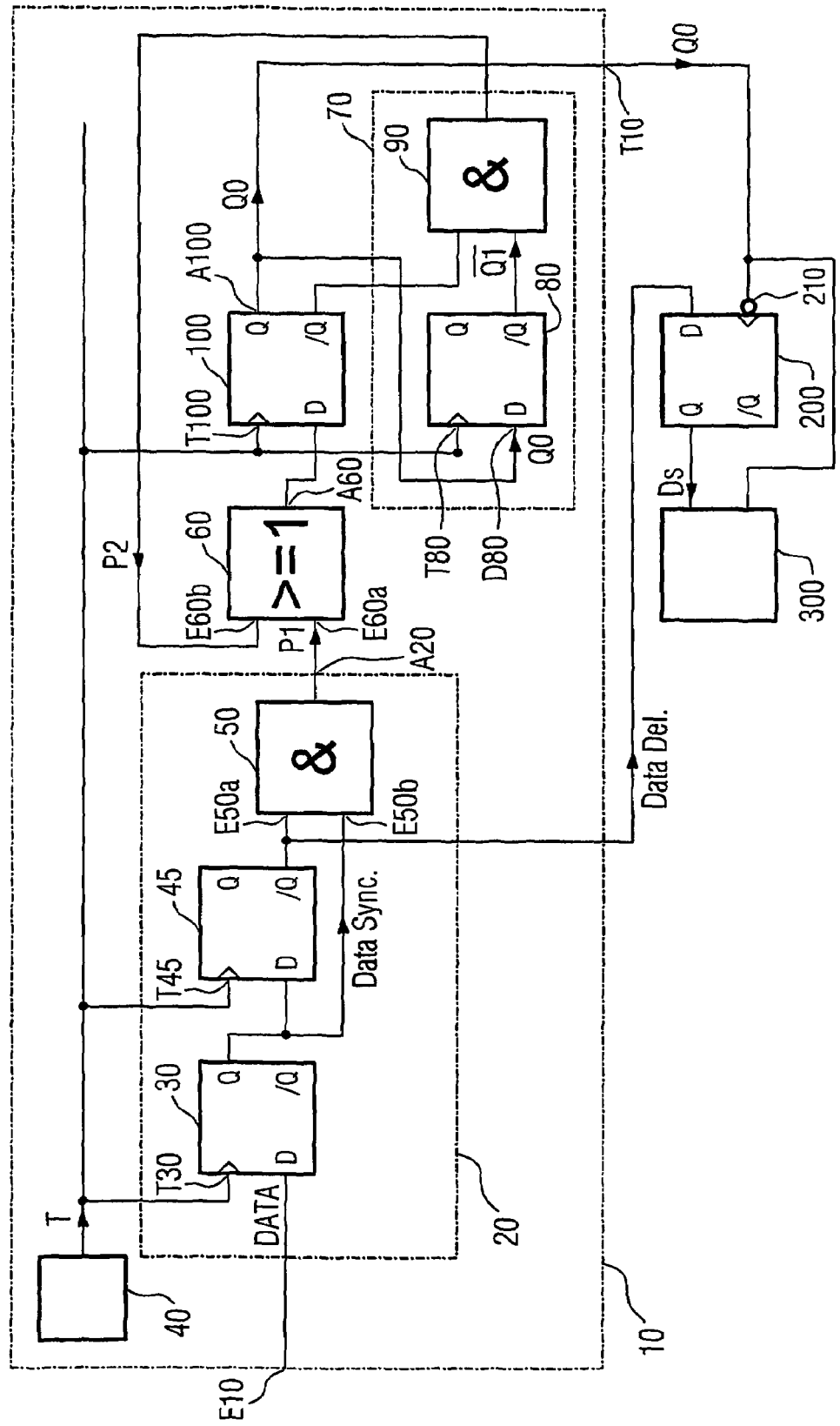
FIG. 1 shows an exemplary embodiment of a clock signal recovery device according to the invention by means of which the method according to the invention is also explained in greater detail by way of example.

FIG. 1 shows an exemplary embodiment of a clock signal recovery device 10. The clock signal recovery device 10 has at its digital data signal input E10 a signal change detector 20 into which a digital, for example synchronous data signal DATA can be fed. At its input end, the signal change detector 20 is equipped with a D-type flip flop 30, to the D-type signal input of which the data signal DATA is applied. A clock signal input T30 of the D-type flip flop 30 is connected to a free-running clock generator 40 which generates at its output end a clock signal T with a generator frequency ft.

The generator frequency ft is selected in such a manner that it corresponds, for example, to an integral multiple of the nominal clock signal frequency fn of the data signal DATA. In the text which follows, it is assumed by way of example that the nominal clock signal frequency fn of the data signal DATA is fn=125 MHz so that the generator frequency ft accordingly has a value of ft=375 MHz for the case of a multiple of three.

A nominal clock signal frequency of 125 MHz occurs, for example, in data signals which are transmitted in the Fast Ethernet 100BaseFX standard. The Fast Ethernet standard usually operates with a data rate of 100 MBits for a second so that, with a 4B/5B coding, a line coding or Baud rate of 125 MBaud or a corresponding clock signal frequency of 125 MHz occurs.

The D-type flip flop 30 follows at the output a further D-type flip flop 45, the clock signal input T45 of which is also connected to the free-running clock generator 40. The inverted output /Q of the further D-type flip flop 45 is connected to an input E50a of an AND gate 50. A further input E50b of this AND gate 50 is connected to the output Q of the D-type flip flop 30. Thus, the signal "Data Del." formed by the further D-type flip flop 45 at its output and the output signal "Data Sync" of the D-type flip flop 30 are thus present at the two inputs E50a and E50b of the AND gate 50.

The output signal of the AND gate 50 is identified by the reference symbol P1 in FIG. 1; this is delivered at an output A20 of the signal change device 20 and thus fed into an input E60a of an OR gate 60. Auxiliary pulses P2 of an auxiliary pulse generating device 70 are applied to a further input E60b of the OR gate 60.

The auxiliary pulse generating device 70 has at its input a D-type flip flop 80 which is followed by an AND gate 90. The output of the AND gate 90 generates the auxiliary pulses P2 which pass to the further input E60b of the OR gate 60.

A clock signal input T80 of the D-type flip flop 80 is connected to the free-running clock generator 40; the D-type signal input D80 of the D-type flip flop 80 is connected to the Q output of a D-type flip flop 100 forming an output device. The clock signal input T100 of the D-type flip flop 100 is connected to the free-running clock generator 40 and the D-type signal input of the D-type flip flop 100 is connected to the output A60 of the OR gate 60.

As can also be seen in FIG. 1, the clock signal recovery device 10 is also connected to a sampling device 200 which samples the delayed data signal "Data Del.", formed by the further D-type flip flop 45 of the signal change detector 20 with the "recovered" clock signal Q0 delivered at the clock signal output T10 of the clock signal recovery device 10, namely with its falling edge. As an alternative, the inverted signal /Q0 of the flip flop 100 could also be used for sampling with the positive edge; the inverter 210 in front of the clock signal input of flip flop 200 would be superfluous in this case.

As will still be described in greater detail further below, the D-type flip flop 80 and the AND gate 90 of the auxiliary pulse generating device 70 and the D-type flip flop 100 together form a counter which can assume three binary numeric values, namely the binary numeric values "11", "10" and "01" at the /Q outputs of the two flip flops 80 and 100 and the binary numeric values "00", "10" and "01" at the Q outputs of the two flip flops 80 and 100.

Figure 2:
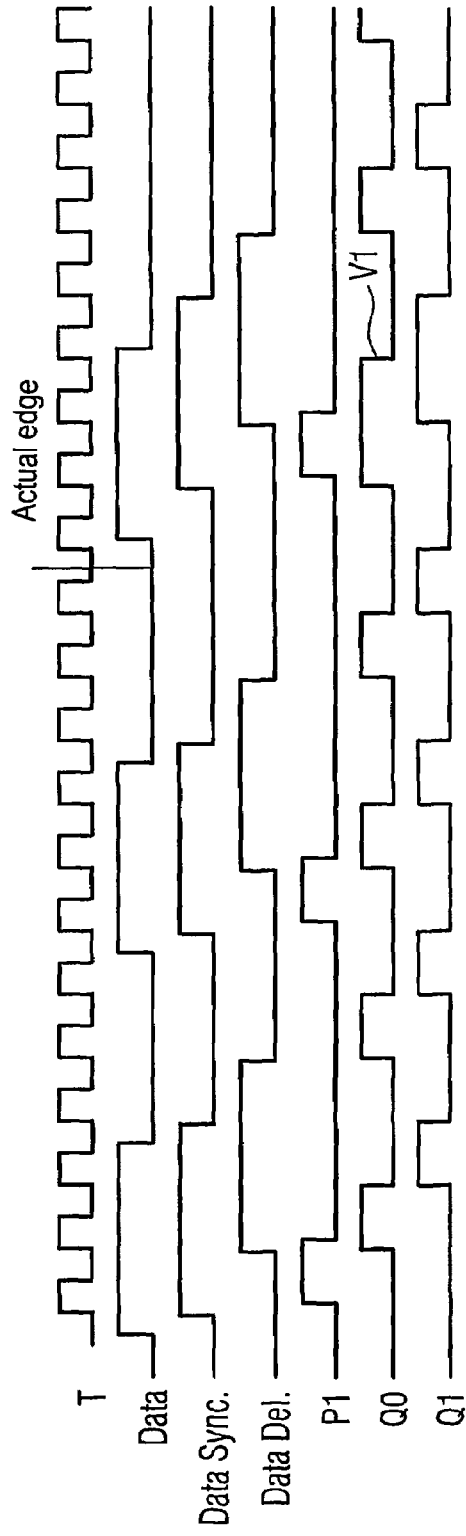
FIG. 2 shows the signal variations occurring in the clock signal recovery device according to FIG. 1 for the exemplary case that the recovered clock signal has an output pulse which is lengthened in time.

The operation of the clock signal recovery device 10 according to FIG. 1 will be explained in greater detail with reference to FIGS. 2 and 3 in the text which follows:

FIG. 2 shows the clock signal T of the free-running clock generator 40 which has a clock signal frequency ft=375 MHz. Below the clock signal T, the data signal DATA is shown, the variation of which is only meant by way of example in this case. The data signal DATA can be, for example, a 4B/5B-coded signal which is transferred into an Ethernet-compatible format.

The data signal DATA passes to the D-type flip flop 30 of the signal change detector 20 which generates at its output the slightly delayed data signal "Data Sync". The "Data Sync" signal is fed into the further D-type flip flop 40 which forms at its output a signal which is delayed further, namely the signal "Data Del." (delayed).

With the two signals "Data Del." and "Data Sync", the AND gate 50 forms at its output the pulses P1 which, seen illustratively, in each case signal signal changes of the data signal DATA. Since the data signal DATA now exhibits signal changes less frequently than would correspond to the clock signal frequency ft=125 MHz of the data signal DATA, the output signal of the AND gate 50 correspondingly also has fewer pulses P1 than corresponds to the nominal clock signal frequency fn of the data signal DATA.

To generate a recovered clock signal Q0, further pulses, called auxiliary pulses in the text which follows, must thus be formed. The auxiliary pulses are generated by the auxiliary pulse generating device 70 which generates the auxiliary pulses P2 with the nominal clock signal frequency of the data signal DATA and transfers these to the OR gate 60. In this context, the auxiliary pulses P2 have a frequency corresponding to the nominal clock signal frequency of the data signal DATA since the two flip flops 80 and 100 and the AND gate 90 form a frequency divider which reduces the generator clock frequency ft of the clock generator 40 by a factor of 3. The auxiliary pulses P2 thus already correspond relatively accurately to the clock frequency of the data signal DATA present at the input end, apart from their phase angle.

As soon as either an auxiliary pulse P2 or a pulse P1 is then present at the OR gate 60, it is passed through to the D-type input of the flip flop 100 so that a signal Q0 with a logical 1 is generated at the output as soon as a corresponding trigger signal is generated by the clock generator 40 and forwarded to the clock signal input T100 of the flip flop 100.

The variation with time of the output pulses formed by the D-type flip flop 100 which, at the same time, also form the recovered clock signal Q0 of the clock signal recovery device 10 is shown in FIG. 2. It can be seen that, due to the superimposition of the pulses P1 and of the auxiliary pulses P2, the recovered clock signal Q0 becomes synchronized with the data signal DATA in that, for example, a lengthening of pulses or a shortening of spacing occurs.

A lengthened output pulse is identified by the reference symbol V1 in FIG. 2.

Figure 3:
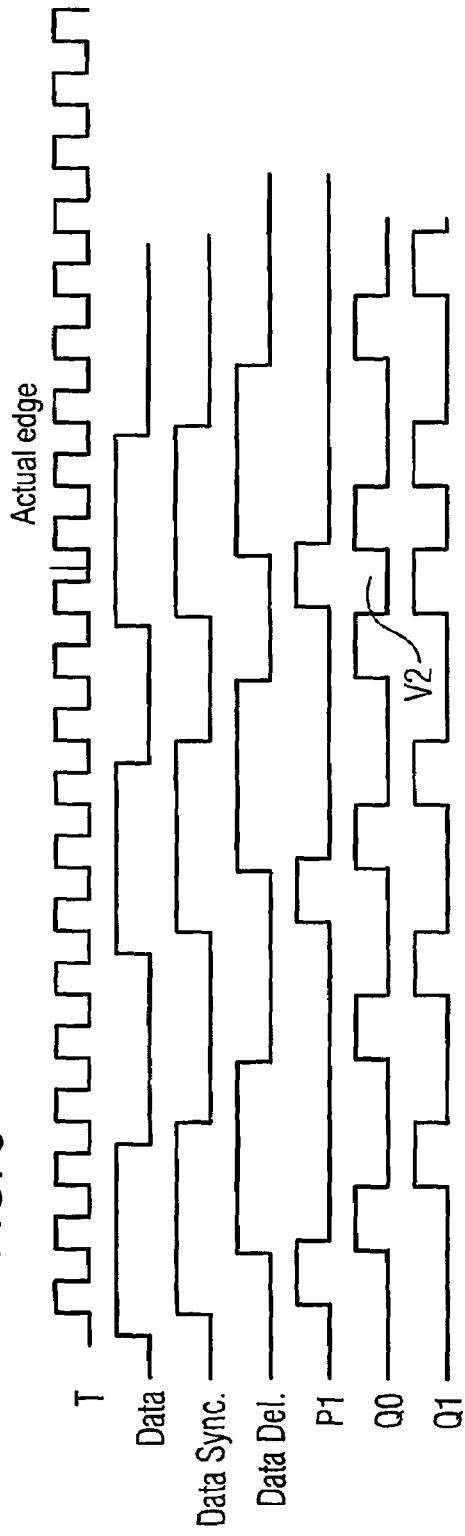
FIG. 3 shows the signal variations occurring in the clock signal recovery device according to FIG. 1 for the exemplary case where the recovered clock signal has a pulse spacing which is shortened in time.

Instead of a pulse lengthening, a shortening of the time intervals between the output pulses Q0 of the D-type flip flop 100 can also occur due to the superimposition of the pulses P1 and of the auxiliary pulses P2; this is shown by way of example in FIG. 3. The shortened interval is identified by the reference symbol V2 in FIG. 3.

The recovered clock signal Q0 can now be used for sampling the delayed data signal "Data Del." with the negative edge; for this purpose, the D-type flip flop 200 according to FIG. 1, forming a sampling device, is used. At the output end, a synchronized sampling signal Ds is formed in this case which, in turn, can be evaluated with a decoding unit known from the prior art which operates, for example, in accordance with the 4B/5B method. The corresponding decoding unit is identified by the reference symbol 300 in FIG. 1.

Figure 4:
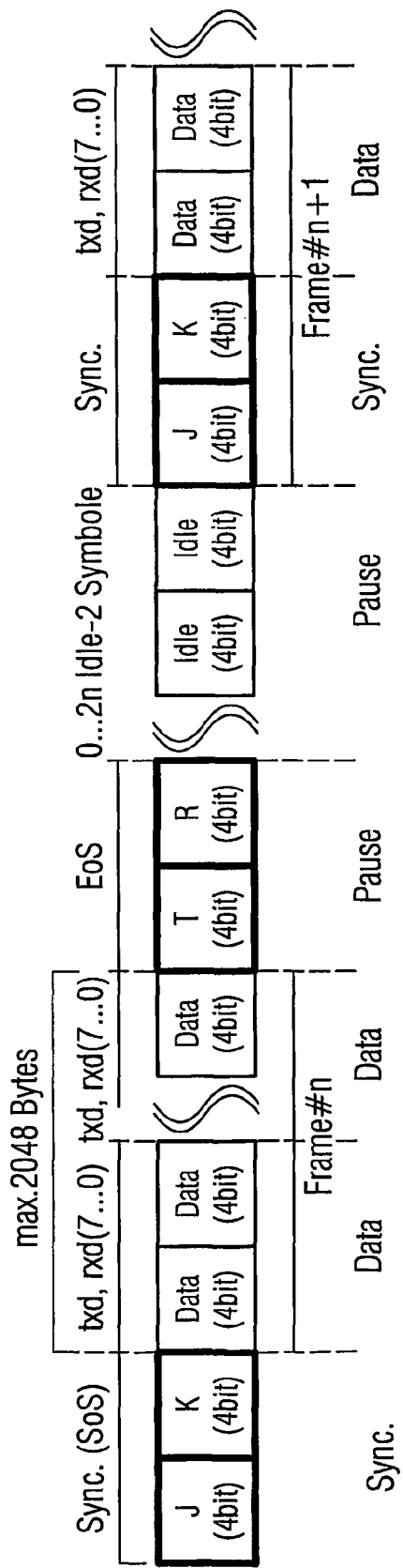
FIG. 4 shows by way of example the structure of a data packet of a data signal for the clock signal recovery device according to FIG. 1.

FIG. 4 shows by way of example how the bits of the data signal DATA can be structured. FIG. 4 shows that the symbol combination J/K is in each case sent as synchronization character at the beginning of a data stream so that the beginning of a data packet transmission can be determined at the receiving end. After the end of a data packet transmission, signal changes are preferably exclusively transmitted until a next synchronization character in the form of a symbol combination J/K symbolizes the beginning of a next data packet. The signal changes between individual data packets are identified by the term "Idle" in FIG. 4.

The decoding unit 300 according to FIG. 1 can contain, for example, a shift register which is operated with the recovered clock signal Q0 of the clock signal recovery device 10. At a parallel output of the shift register, a check is made with each clock signal change whether a characteristic bit pattern is found: such a characteristic bit pattern can be formed, for example, by a synchronization character which corresponds to the synchronization symbol J/K shown in FIG. 4. If this is the case, the evaluation of the data signals DATA present at the input can begin.

In the exemplary embodiment according to FIG. 1, it was assumed by way of example that the data signal DATA is sampled with a generator frequency which corresponds to triple the nominal clock signal frequency of the data signal. As an alternative, a higher clock frequency can also be used for sampling the data signal. If the generator frequency ft of the clock generator 40 is n-times the Baud rate or the nominal frequency fn of the data signal DATA, respectively, the regenerated clock Q0 at the output of flip flop 100 can have a time interval from the clock of the data signal of (n−1)*Ta, n*Ta and (n+1)*Ta, where Ta designates the duration of a period of the clock signal T.

The clock signal recovery method described can be carried out with digital circuits, e.g. with ASIC or FPGA chips because only gates and flip flops are needed and no analog elements such as time delay elements or the like. The method can be implemented, for example, in transmitters and receivers which operate in accordance with a 4B/5B or an 8B/10B line coding.

In addition, the method described is compatible with all communication protocols, for example also with the Fast Ethernet 100BaseFX protocol. If the data rate is, for example 100 MBits per second (=125 MBaud), a clock signal by means of which a digital data signal present at the input end can be evaluated can already be recovered purely digitally with a generator clock signal of 375 MHz.

The clock signal recovery described can be utilized in many technical fields, particularly also in the area of magnetic levitation trains.

LIST OF REFERENCE DESIGNATIONS

10 Clock signal recovery device
20 Signal change detector
30 D-type flip flop
40 Clock generator
45 Further D-type flip flop
50 AND gate
60 OR gate
70 Auxiliary pulse generating device
80 D-type flip flop
90 AND gate
100 D-type flip flop
200 Sampling device
210 Inverter
300 Decoding unit
A20 Output
A60 Output
E10 Signal input
E50a, E50b Inputs
E60a, 60b Inputs
T80 Clock signal input
T100 Clock signal input
D80 Data input
DATA Data signal
Data Syn. Data signal
Data Del. Delayed signal
fn Nominal clock frequency
ft Generator frequency
Idle Signal change
J/K Synchronization character
P1 Pulses
P2 Auxiliary pulses
Q0 Recovered clock signal
T Generator clock
Ta Duration of period
V Lengthened output pulse
V2 Shortened pulse interval

The invention claimed is:
1. A clock signal recovery apparatus, comprising:
a digital circuit forming a clock signal recovery device;
said digital circuit having a digital data signal input for receiving a digital data signal, the digital data signal having a predetermined nominal clock signal frequency;

said digital circuit having a clock signal output for outputting a recovered clock signal; and said digital circuit further having:

a signal change detector for detecting signal changes of at least one predetermined type of signal change in the data signal and for generating a pulse with each signal change;

an auxiliary pulse generating device for generating auxiliary pulses with the nominal clock frequency of the data signal; and an output device connected to said signal change detector and said auxiliary pulse generating device, said output device in each case forming an output pulse when a pulse is present and when an auxiliary pulse is present and generating the recovered clock signal with the output pulses thus formed.

2. The clock signal recovery apparatus according to claim 1, wherein said auxiliary pulse generating device has an input connected to an output of said output device and said auxiliary pulse generating device is configured to have a timing of the generation of the auxiliary pulses controlled by output pulses of the recovered clock signal.

3. The clock signal recovery apparatus according to claim 1, wherein said auxiliary pulse generating device is configured to generate an auxiliary pulse in each case after expiry of a duration of a period corresponding to the nominal clock signal frequency, or a multiple thereof, after an output pulse of the recovered clock signal.

4. The clock signal recovery apparatus according to claim 1, wherein said digital circuit forming the clock signal recovery device comprises a free-running clock generator, and said generator has a generator frequency at a predetermined multiple of the nominal clock signal frequency of the data signal.

5. The clock signal recovery apparatus according to claim 4, wherein the predetermined multiple is an integral multiple and is at least three.

6. The clock signal recovery apparatus according to claim 4, wherein said signal change detector is connected to receive the output signal of said clock generator and said signal change detector is configured to detect the signal changes of the data signal by oversampling with the generator frequency.

7. The clock signal recovery apparatus according to claim 1, wherein said output device is a flip flop.

8. The clock signal recovery apparatus according to claim 7, wherein said flip flop, together with said auxiliary pulse generating device, forms a binary counter configured to count at least up to the predetermined multiple in binary notation.

9. The clock signal recovery apparatus according to claim 1, wherein said digital circuit consists exclusively of digital gates or flip flops.

10. The clock signal recovery apparatus according to claim 1, wherein said digital circuit is an FPGA chip.

11. The clock signal recovery apparatus according to claim 1, wherein said digital circuit is an ASIC chip.

12. A method of generating a recovered clock signal from a digital data signal, which comprises:

receiving a digital data signal with a predetermined nominal clock signal frequency;

sampling the data signal with a generator frequency corresponding to an integral multiple of the nominal clock signal frequency and detecting signal changes of at least one predetermined type of signal change of the data signal, and generating a pulse with each signal change;

generating auxiliary pulses with the nominal clock frequency;

recovering the clock signal from the digital data signal only digitally and outputting the recovered clock signal; and thereby, when a pulse or an auxiliary pulse is present, forming an output pulse in each case and generating the recovered clock signal by way of the output pulses thus formed.

* * * * *